(12) United States Patent
Tikhonov (10) Patent No.: US 6,279,889 B1
(45) Date of Patent: Aug. 28, 2001

(54) LOOSE DIE FIXTURE

(75) Inventor: Victor Tikhonov, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/488,438

(22) Filed: Jan. 20, 2000

(51) Int. Cl.[7] ............................................. B25B 5/16
(52) U.S. Cl. ................................. 269/268; 269/41
(58) Field of Search ........................ 269/268, 365, 269/903, 254 CS, 203, 41, 42

(56) References Cited

U.S. PATENT DOCUMENTS

| 121,851 | * | 12/1871 | Cornish | 269/41 |
| 2,417,144 | * | 3/1947 | Trimble | 269/41 |

FOREIGN PATENT DOCUMENTS

| 513060 | * | 3/1930 | (DE) | 269/41 |
| 2809584 | * | 9/1979 | (DE) | 269/41 |
| 1352980 | * | 5/1974 | (GB) | 269/41 |
| 616014 | * | 12/1976 | (SU) | 269/41 |
| 8607232 | * | 5/1974 | (WO) | 269/41 |

* cited by examiner

*Primary Examiner*—Joseph J. Hail, III
*Assistant Examiner*—Daniel Shanley (57) ABSTRACT

A fixture for holding an integrated circuit. The integrated circuit is of the type having a front side and an opposing back side. The fixture positions the integrated circuit for simultaneously electrically probing and viewing both the front side and the back side of the integrated circuit. A supporting brace provides a support that is immobile in at least a first direction, against which to cooperatively brace the integrated circuit. A first jaw piece is disposed adjacent the supporting brace. The first jaw piece has a vee shape for receiving a first corner of the integrated circuit and cooperatively aligns the integrated circuit into a position for simultaneously electrically probing and viewing the front side and the back side of the integrated circuit. An adjustable brace provides a movable second position in the first direction relative to the supporting brace, against which to cooperatively brace the integrated circuit with the supporting brace. A second jaw piece is disposed adjacent the adjustable brace. The second jaw piece also has a vee shape for receiving a second corner of the integrated circuit, where the second corner is disposed in an opposing position to the first corner of the integrated circuit and cooperatively aligns the integrated circuit into a position for simultaneously electrically probing and viewing the front side and the back side of the integrated circuit. Retaining means adjustably retain the adjustable brace relative to the supporting brace.

20 Claims, 3 Drawing Sheets

LOOSE DIE FIXTURE

FIELD

This invention relates to the field of integrated circuit testing. More particularly the invention relates to a fixture for holding integrated circuits for testing.

BACKGROUND

Integrated circuits are preferably tested in either wafer form or packaged form. When the integrated circuits are in either of these two forms, they are relatively easy to handle. For example, before a wafer is diced into individual integrated circuit chips, the wafer is large and easy to mount and position relative to a test station. Because of the size of the wafer, it is relatively easy to hold the wafer from positions on the wafer that do not physically interfere with either electrically probing or viewing the device under test. Similarly, packaged devices are also relatively easy to test compared to individual devices. Once the individual integrated circuit device is mounted and electrically connected to the packaging, the package is easily mounted and electrically connected to a test station.

However, sometimes it is necessary to test an integrated circuit that is neither in wafer form nor in package form. This need might arise either between the time that the wafer is diced and the individual devices are packaged, or after a device has been removed from its packaging for some reason, such as during failure analysis.

Special problems are encountered when testing individual devices. For example, because of the small size of individual devices, compared to either wafers or packages, they are more difficult to hold. Further, and also because of the small size of individual devices, they tend to be more difficult to hold in a manner that allows the device to be viewed or electrically probed. This problem is compounded when it is important for both the front and back surfaces of the device to be probed or viewed during testing. Further, individual devices tend to be far more fragile than packaged devices, and thus they are more easily damaged during testing than are packaged devices.

What is needed, therefore, is a fixture that allows an individual integrated circuit device to be safely held such that both surfaces of the integrated circuit can be probed, viewed, or both.

SUMMARY

The above and other needs are met by a fixture for holding an integrated circuit. The integrated circuit is of the type having a front side and an opposing back side. Thus, it is desired that the fixture allow for positioning the integrated circuit for simultaneously electrically probing and viewing both the front side and the back side of the integrated circuit.

A supporting brace provides a support that is immobile in at least a first direction, against which to cooperatively brace the integrated circuit. A first jaw piece is disposed adjacent the supporting brace. The first jaw piece receives the integrated circuit and cooperatively aligns the integrated circuit into a position for simultaneously electrically probing and viewing both the front side and the back side of the integrated circuit. The first jaw piece also has a vee shape for receiving a first corner of the integrated circuit.

An adjustable brace provides a movable second position in the first direction relative to the supporting brace, against which to cooperatively brace the integrated circuit with the supporting brace. A second jaw piece is disposed adjacent the adjustable brace. The second jaw piece receives the integrated circuit and cooperatively aligns the integrated circuit into a position for simultaneously electrically probing and viewing both the front side and the back side of the integrated circuit The second jaw piece also has a vee shape for receiving a second corner of the integrated circuit, where the second corner is disposed in an opposing position to the first corner of the integrated circuit.

Retaining means adjustably retain the adjustable brace relative to the supporting brace.

Thus, this embodiment of a fixture according to the present invention holds an individual integrated circuit by opposing corners between two braces. The adjustable brace, in cooperation with the retaining means, provides compressive force in the first direction on the integrated circuit in cooperation with the supporting brace, which is immobile in the first direction. The first jaw piece and the second jaw piece, by holding the integrated circuit at the corners, allow for both the front side and the back side of the integrated circuit to be accessible. Thus, both the front side and the back side of the integrated circuit can be either electrically probed or viewed while the integrated circuit is mounted within the fixture.

In various preferred embodiments of the invention, the retaining means include a thumbscrew, spring, or both. First and second guide rails are preferably provided, disposed in an immobile position relative to the first direction, and receive the adjustable brace and guide it in the first direction toward the supporting brace. The first and second jaw pieces preferably have a thickness that is about twice the thickness of the integrated circuit, and a vee shaped cross section of about 120 degrees. This provides a self centering action on the integrated circuit in two different directions. The self centering action in one direction is provided by the general vee shape of the jaw pieces, and the self centering action in the other direction is provide by the vee shaped cross section. The general vee shape of the jaw pieces is preferably a ninety degree angle, to match the opposing corners of the integrated circuit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
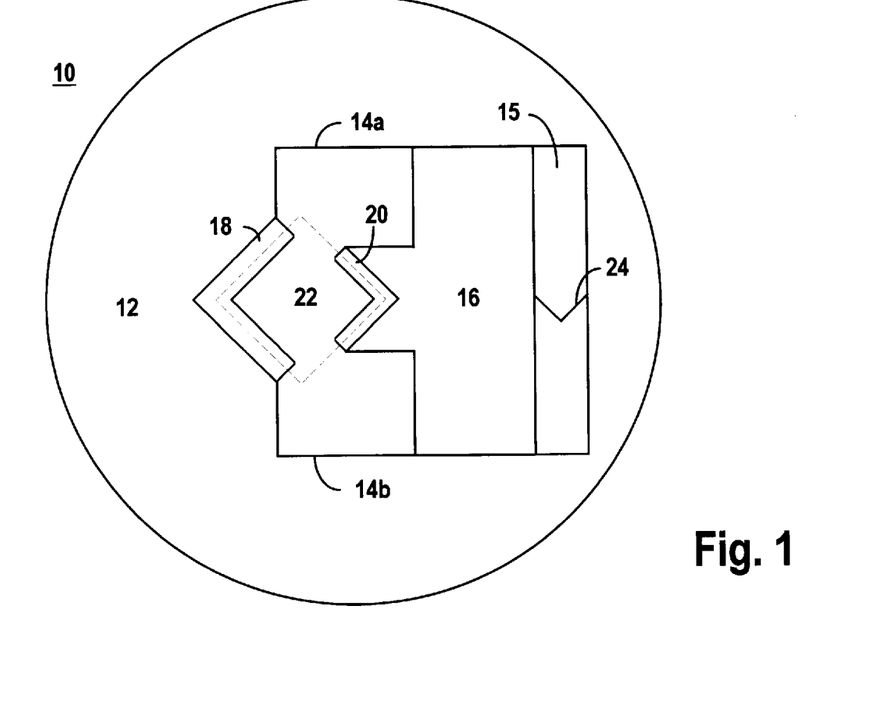
FIG. 1 is a top plan view of a first embodiment of the invention.

Referring now to FIG. 1, there is depicted a first embodiment of a fixture 10 according to the present invention. In this embodiment, the largest element of the fixture 10 is the supporting brace 12, which has a generally circular outline, and is generally disk shaped. It is appreciated that the supporting brace 12 can have other forms as well, but this simplified form serves well for the purpose of explaining the construction and operation of the fixture 10.

The supporting brace 12 is preferably formed of a durable material, so that it does not unduly deteriorate with use. In addition, the material selected for the supporting brace 12 is preferably rigid, so that it does not unduly deform under the stresses that are induced when the integrated circuit 22 is retained in the fixture 10, as more completely described below. Materials such as, but not limited to, steel, aluminum, and fluoropolymer resins sold under the trademark TEFLON tend to work well for construction of the supporting brace 12. However, other materials that are consistent with the design criteria described above may also be used to construct the supporting brace 12.

A first jaw piece 18 is disposed adjacent to the supporting brace 12. While in some embodiments the first jaw piece 18 is permanently connected to the supporting brace 12 in some appropriate manner, in a most preferred embodiment the first jaw piece 18 is selectively removable from the supporting brace 12, so that first jaw pieces 18 of various sizes and shapes can be used with the fixture 10, as described more completely below. One method of disposing the first jaw piece 18 is to press fit the supporting brace 12 into a slot in the first jaw piece 18. In this manner, the fixture 10 can be used with integrated circuits 22 (shown in phantom) of different sizes.

As seen in FIG. 1, the first jaw piece 18 is generally vee shaped. One corner of the integrated circuit 22 is received by the vee portion of the first jaw piece 18, between the two legs of the first jaw piece 18. In this manner, the first jaw piece 18 provides a self centering action against the integrated circuit 22 in this first orientation, which is within the plane of the integrated circuit 22. The angle of the vee of the first jaw piece 18 is most preferably ninety degrees, as this coincides with the angle most commonly used for the corners of an orthogonal integrated circuit 22. However, in other embodiments, the angle of the vee is selected as something other than ninety degrees, which may or may not coincide with the angle of the corners of the integrated circuit 22.

Figure 3:
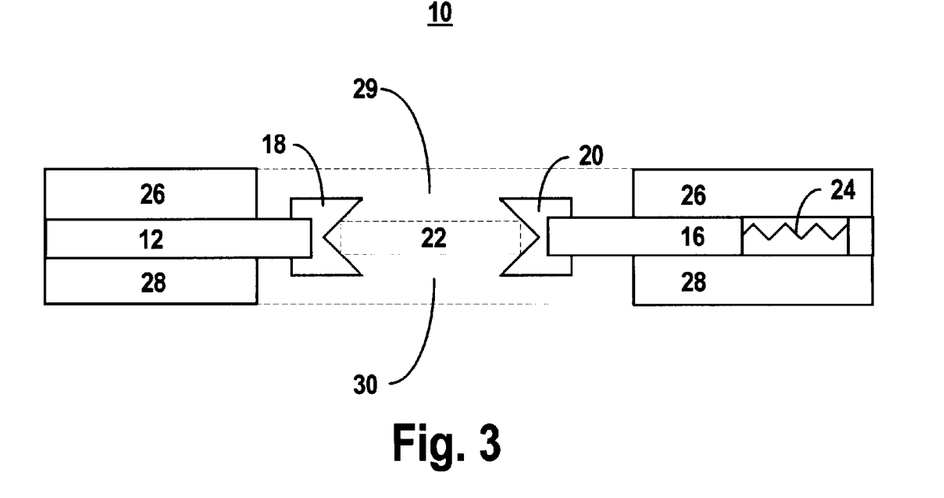
FIG. 3 is a cross sectional view of the second embodiment of the invention.

As indicated by the position of the phantom edge line of the integrated circuit 22 in FIG. 1, and as more explicitly depicted in the cross sectional view of FIG. 3, the first jaw piece 18 also preferably has a vee shaped cross section. In this manner, portions of both the top and bottom edges of the first jaw piece 18 extend to a very small degree over the front and back surfaces of the integrated circuit 22, respectively. The vee shaped cross section of the first jaw piece 18 provides for a self centering of the integrated circuit 22 in a second orientation, which is perpendicular to the plane of the integrated circuit 22, and also provides a retaining action against the integrated circuit 22. In this manner, pressure may be applied against either or both of the front surface and the back surface of the integrated circuit 22, such as might be applied by electrical probes, without the integrated circuit 22 becoming dislodged from the fixture 10.

In a most preferred embodiment the angle of the vee cross section of the first jaw piece 18 is about 120 degrees. When the first jaw piece 18 has a thickness of approximately twice the thickness of the integrated circuit 22, this angle of the vee cross section provides adequate retaining of the integrated circuit 22, without the top and bottom edges of the first jaw piece 18 extending to so great an extent across the front and back surfaces of the integrated circuit 22 as to substantially impair the ability to electrically probe or view the front and back surfaces of the integrated circuit 22. This angle also works well with other thicknesses of the first jaw piece 18, because it tends to reduce chipping and cracking of the integrated circuit 22 at the edges of the integrated circuit 22.

The first jaw piece 18 is preferably formed of a durable material so as to have a long utile life. In addition, the first jaw piece 18 is preferably formed of a material that provides an adequate resistance to the pressure that is placed upon it while the integrated circuit 22 is retained in the fixture, as described more completely below. However, another preferred characteristic of the first jaw piece 18 is that it provides for some degree of compression from the integrated circuit 22, so that there is some amount of flexibility within the first jaw piece 18 when the integrated circuit 22 is pressed against it and retained by it. This latter characteristic also helps to reduce chipping and cracking of the integrated circuit 22 at the edges of the integrated circuit 22. Fluoropolymer resins sold under the trademark TEFLON have been found to be a good material for the construction of the first jaw piece 18. However, other materials that are compatible with the design criteria given above may also be selected for fabrication of the first jaw piece 18.

In one special embodiment, where both the supporting brace 12 and the first jaw piece 18 may or may not be constructed of the same material, such as fluoropolymer resins sold under the trademark TEFLON, the supporting brace 12 and the first jaw piece 18 may or may not be formed from a single piece of material, and may or may not be selectively detachable one from the other. In this embodiment, the fixture 10 tends to accept integrated circuits 22 of only a set range of sizes, as the first jaw piece 18 can not be removed from the supporting brace 12 and replaced with an alternate jaw piece of a different size. However, in those instances where only integrated circuits 22 of the size compatible with the first jaw piece 18 are to be tested, this embodiment may be the simplest and least expensive embodiment.

An adjustable brace 16 is provided to cooperatively brace the integrated circuit 22 with the supporting brace 12. The adjustable brace 16 provides a movable second position relative to the supporting brace 12. In the embodiment depicted in FIG. 1, the adjustable brace 16 fits within an orifice 15 formed within the supporting brace 12. It is appreciated that the adjustable brace 16 can have other forms as well, but this simplified form serves well for the purpose of explaining the construction and operation of the fixture 10.

As also described in regard to the supporting brace 12, the adjustable brace 16 is preferably formed of a durable material, so that it does not unduly deteriorate with use. In addition, the material selected for the adjustable brace 16 is preferably rigid, so that it does not unduly deform under the stresses that are induced when the integrated circuit 22 is retained in the fixture 10, as more completely described below. Materials such as, but not limited to, steel, aluminum, and fluoropolymer resins sold under the trademark TEFLON tend to work well for construction of the adjustable brace 16. However, other materials that are consistent with the design criteria described above may also be used to construct the adjustable brace 16.

A second jaw piece 20 is disposed adjacent to the adjustable brace 16. As mentioned above, while in some embodiments the second jaw piece 20 is permanently connected to the adjustable brace 16 in some appropriate manner, in a most preferred embodiment the second jaw piece 20 is selectively removable from the adjustable brace 16, so that second jaw pieces 20 of various shapes and sizes can be used with the fixture 10. One method of disposing the second jaw piece 20 is to press fit the adjustable brace 16 into a slot in the second jaw piece 20. As described above, in this manner, the fixture 10 can be used with integrated circuits 22 of different sizes.

As seen in FIG. 1, and similar to the construction of the first jaw piece 18, the second jaw piece 20 is generally vee shaped. One corner of the integrated circuit 22 is received by the vee portion of the second jaw piece 20, between the two legs of the second jaw piece 20. In this manner, the second jaw piece 20 provides a self centering action against the integrated circuit 22 in the first orientation. The second jaw piece 20 preferably receives the second corner of the integrated circuit 22, which is disposed in an opposing position relative to the first corner of the integrated circuit 22, which is received by the first jaw piece 18. The angle of the vee of the second jaw piece 20 is most preferably ninety degrees, as this coincides with the angle most commonly used for the corners of an orthogonal integrated circuit 22. However, in other embodiments, the angle of the vee is selected as something other than ninety degrees, which may or may not coincide with the angle of the corners of the integrated circuit 22.

As indicated by the position of the phantom edge line of the integrated circuit 22 in FIG. 1, and again as more explicitly depicted in the cross sectional view of FIG. 3, the second jaw piece 20 also preferably has a vee shaped cross section. In this manner, portions of both the top and bottom edges of the second jaw piece 20 extend to a very small degree over the front and back surfaces of the integrated circuit 22, respectively. The vee shaped cross section of the second jaw piece 20 provides for a self centering of the integrated circuit 22 in the second orientation, and also provides a retaining action against the integrated circuit 22, all in cooperation with the first jaw piece 18, as described above. In this manner, pressure may be applied against either or both of the front surface and the back surface of the integrated circuit 22, such as might be applied by electrical probes, without the integrated circuit 22 becoming dislodged from the fixture 10.

In a preferred embodiment the angle of the vee cross section of the second jaw piece 20 is the same as that of the first jaw piece 18, which in the most preferred embodiment is about 120 degrees. When the second jaw piece 20 has a thickness of approximately twice the thickness of the integrated circuit 22, this angle of the vee cross section provides adequate retaining of the integrated circuit 22, without the top and bottom edges of the second jaw piece 20 extending to so great an extent across the front and back surfaces of the integrated circuit 22 as to substantially impair the ability to electrically probe or view the front and back surfaces of the integrated circuit 22. This angle also works well with other thicknesses of the second jaw piece 20, because it tends to reduce chipping and cracking of the integrated circuit 22 at the edges of the integrated circuit 22.

As described above in regard to the first jaw piece 18, the second jaw piece 20 is preferably formed of a durable material so as to have a long utile life. In addition, the second jaw piece 20 is preferably formed of a material that provides an adequate resistance to the pressure that is placed upon it while the integrated circuit 22 is retained in the fixture, as described more completely below. However, another preferred characteristic of the second jaw piece 20 is that it provides for some degree of compression from the integrated circuit 22, so that there is some amount of flexibility within the second jaw piece 20 when the integrated circuit 22 is pressed against it and retained by it. This latter characteristic also helps to reduce chipping and cracking of the integrated circuit 22 at the edges of the integrated circuit 22. Fluoropolymer resins sold under the trademark TEFLON have been found to be a good material for the construction of the second jaw piece 20. However, other materials that are compatible with the design criteria given above may also be selected for fabrication of the second jaw piece 20.

In one special embodiment, where both the adjustable brace 16 and the second jaw piece 20 may or may not be constructed of the same material, such as fluoropolymer resins sold under the trademark TEFLON, the adjustable brace 16 and the second jaw piece 20 may or may not be formed from a single piece of material, and may or may not be selectively detachable one from the other. In this embodiment, the fixture 10 tends to accept integrated circuits 22 of only a set range of sizes, as the second jaw piece 20 can not be removed from the adjustable brace 16 and replaced with an alternate jaw piece of a different size. However, in those instances where only integrated circuits 22 of the size compatible with the second jaw piece 20 are to be tested, this embodiment may be the simplest and least expensive embodiment.

Most preferably, the second jaw piece 20 is smaller than the first jaw piece 18. By smaller it is meant that the two legs that form the vee of the second jaw piece 20 do not extend to as great a length outward from the vee intersection as do the two legs that form the vee of the first jaw piece 18. This is depicted in FIG. 1. All other dimensions of the second jaw piece 20 can be identical to the corresponding dimensions of the first jaw piece 18 in this embodiment, although that is not a requirement. It is appreciated that it is also not a requirement that the second jaw piece 20 be the one of the two jaw pieces 18 and 20 that is smaller in this embodiment. It is equally applicable for the first jaw piece 18 to be smaller than the second jaw piece 20 in this embodiment, as described above or for one leg of the first jaw piece 18 or the second jaw piece 20 or both to be shorter than the other leg for better retention of non square integrated circuits 22.

One benefit of constructing one of the jaw pieces 18 and 20 to be smaller than the other is that a wider range of sizes of integrated circuited 22 can then be accommodated by the fixture 10. In the embodiment depicted in FIG. 1, integrated circuits 22 having a range of sizes from as large as the opening 15 in the supporting brace 12 to as small as a side length just greater than the length of the legs of the second jaw piece 20 are accommodated by the fixture 10. This is possible because the second jaw piece 20, because the legs are shorter than those of the first jaw piece 18, can fit between the legs of the first jaw piece 18 to some extent. In this manner, the longer legs of the first jaw piece 18 provide additional stability for larger integrated circuits 22, while the shorter legs of the second jaw piece 20 provide the ability for smaller integrated circuits 22 to be held by the fixture 10.

In the embodiment depicted in FIG. 1, the adjustable brace 16 slides between first guide rail 14a and second guide rail 14b. The first guide rail 14a and second guide rail 14b are disposed in an immobile position relative to the first direction, and guide the adjustable brace 16 toward the first jaw piece 18 on the supporting brace 12. The first guide rail 14a and second guide rail 14b are preferably formed of a durable material that does not unduly wear away as the adjustable brace 16 slides back and forth along the first guide rail 14a and second guide rail 14b during use of the fixture 10.

Selection of an appropriate material may depend in part on the material selected for the fabrication of the adjustable brace 16. For example, it may be preferred to select a combination of materials that generate a low degree of friction between the pieces, without the need for lubrication. By removing lubrication from the fixture 10, the possibility of contaminating the integrated circuit 22 with the lubrication is reduced. Forming either the first guide rail 14a and second guide rail 14b or the adjustable brace 16 out of fluoropolymer resins sold under the trademark TEFLON is one good combination. The other piece can be formed of a metal, or may also be formed of fluoropolymer resins sold under the trademark TEFLON.

It is desired that, in the selection of the construction materials for the first guide rail 14a and second guide rail 14b and the adjustable brace 16, the fixture 10 is able to operate smoothly, so that an even pressure is applied to the integrated circuit 22. It is also desired that the mating surfaces between the first guide rail 14a and second guide rail 14b and the adjustable brace 16 not wear away excessively.

In one special embodiment in which the first guide rail 14a and second guide rail 14b are formed of the same material as that selected for the construction of the supporting brace 12, the first guide rail 14a and second guide rail 14b are formed as a single piece with the supporting brace 12, as depicted in FIG. 1. However, in alternate embodiments the first guide rail 14a and second guide rail 14b are separate pieces from the supporting brace 12, and are held immobile in regard to the first direction by either mounting them to the supporting brace 12, or mounting both the first guide rail 14a and second guide rail 14b to another element that holds them immobile in the first direction.

A retaining means is used to maintain compression of the integrated circuit 22 between the first jaw piece 18 of the supporting brace 12 and the second jaw piece 20 of the adjustable brace 16. In the embodiment depicted in FIG. 1, the retaining means is provided by a spring 24, which is held in compression to urge the adjustable brace 16 along the first guide rail 14a and second guide rail 14b toward the first jaw piece 18 of the supporting brace 12, and adjustably retains the adjustable brace 16 relative to the supporting brace 12. In the embodiment depicted in FIG. 1, a first end of the spring 24 is disposed adjacent the adjustable brace 16 and the second end of the spring 24 is disposed adjacent a back portion of the supporting brace 12. In other embodiments, such as those embodiments in which the adjustable brace does not fit within the orifice 15 of the supporting brace 12, the second end of the spring 24 is disposed adjacent a different element, such as an element on which the first guide rail 14a and second guide rail 14b are mounted.

Figure 2:
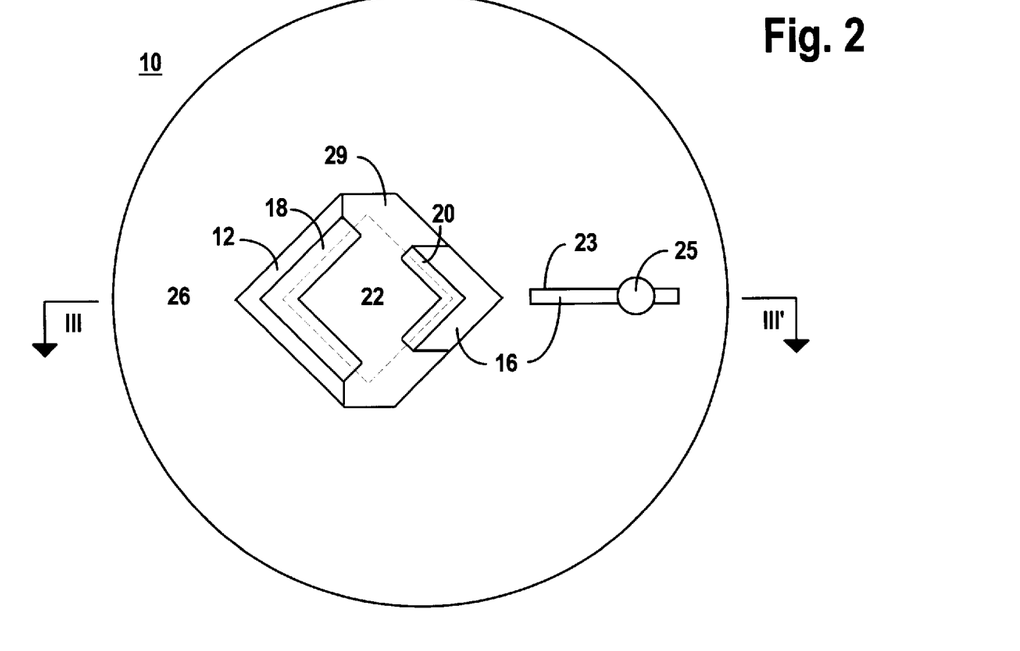
FIG. 2 top plan view of a second embodiment of the invention.

In alternate embodiments, such as that depicted in FIG. 2, the retaining means is a thumbscrew 25 that retains the adjustable brace 16 in regard to an element that is immobile in relation to the first direction. In this manner, pressure is applied to the integrated circuit 22 by manually sliding the adjustable brace 16 toward the first jaw piece 18 of the supporting brace 12, and securing the integrated circuit 22 between the first jaw piece 18 and the second jaw piece 20. Then the thumbscrew 25 is tightened, retaining the adjustable brace 16 in place relative to the supporting brace 12.

In the embodiment of the fixture 10 depicted in FIG. 2, other elements have also been added to the more basic design of the fixture 10 as depicted in FIG. 1. These additional elements are more clearly understood with additional reference to the cross sectional view of FIG. 3. Top plate 26 overlies the supporting brace 12 and the adjustable brace 16, and serves to provide additional stability to the adjustable brace 16 and rigidity to the fixture 10 as a whole. The top plate 26 forms an access port 29, through which at least the first jaw piece 18 and the second jaw piece 20 are seen and accessed, so that the integrated circuit 22 can be placed in the fixture 10. The access port 29 also allows the integrated circuit 22 to be electrically probed and viewed from the top side of the fixture 10.

Further, as depicted in FIG. 2, the thumbscrew 25 selectively retains the adjustable brace 16 against the top plate 26 by moving in slot 23 formed in the top plate 26 when the thumbscrew 25 is loose, and drawing the adjustable brace 16 against the top plate 26 when the thumbscrew 25 is tightened.

In one embodiment, both a thumbscrew 25 and a spring 24 are used in the retaining means. In this manner, the pressure applied against the integrated circuit 22 by the spring 24 can be "locked" by tightening the thumbscrew 25. In this manner, the adjustable brace 16 tends to not inadvertently spring open, such as might occur if the fixture 10 is unintentionally knocked. The thumbscrew 25 can also be used as a handle, from which the adjustable brace 16 is drawn back against the pressure of the spring 24, and then gently allowed to slide forward under the pressure of the spring 24 to secure the integrated circuit 22 between the first jaw piece 18 and the second jaw piece 20.

As depicted in FIG. 3, a bottom plate 28 can also be added to the fixture 10, thus further enclosing and protecting the interior workings of the fixture 10, including elements such as the supporting brace 12, the adjustable brace 16, the first guide rail 14a and second guide rail 14b, and the spring 24. The bottom plate 28 forms an access port 30, through which at least the first jaw piece 18 and the second jaw piece 20 are seen and accessed, so that the integrated circuit 22 can be placed in the fixture 10. The access port 30 also allows the integrated circuit 22 to be electrically probed and viewed from the back side of the fixture 10. In this embodiment, the thumbscrew 25 can be configured to pass completely through a slot formed in the adjustable brace 16 and thread into the bottom plate 28. Thus, the slot of the adjustable brace 16 slides along the thumbscrew 25 when the thumbscrew 25 is loose, and the adjustable brace 16 is pressed between and retained by the top plate 26 and the bottom plate 28 when the thumbscrew 25 is tightened and the bottom plate 28 is drawn up toward the top plate 26.

In a most preferred embodiment, the fixture 10 has a generally round shape, as depicted in FIGS. 1 and 2, with a diameter that is substantially equal to that of a wafer. Typical sizes includes about 100 millimeters, about 150 millimeters, about 200 millimeters, about 250 millimeters, and about 300 millimeters. The benefit of constructing the fixture 10 in one of these sizes and shape is that it can then be loaded into a test station that is designed to hold a wafer of corresponding size. For example, if a fab typically processes 200 millimeter wafers, and has test stations designed to hold 200 millimeter wafers, then the size of the fixture 10 is preferably about 200 millimeters, so that it can be placed in the wafer handling mechanisms of the test stations, and the individual integrated circuit 22 can be tested using the standard test stations and the fixture 10.

Figure 4:
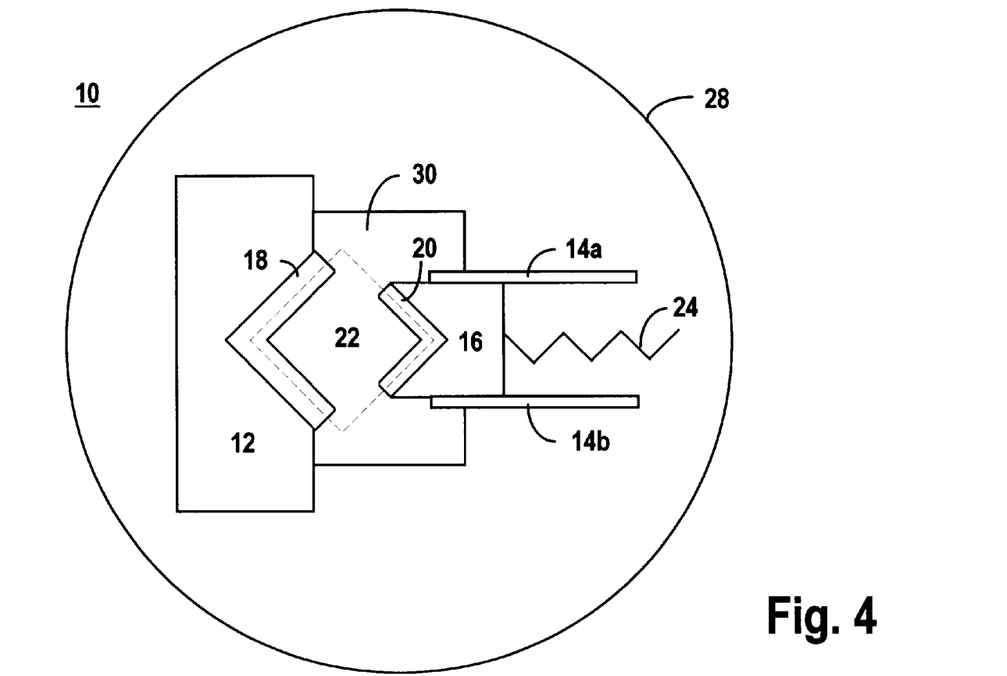
FIG. 4 is top plan view of a third embodiment of the invention.

Depicted in FIG. 4 is a third embodiment of a fixture 10 according to the present invention. In this embodiment, the supporting brace 12 is smaller than in the embodiment depicted in FIG. 1. The supporting brace 12 is mounted to the bottom plate 28, which holds the supporting brace 12 in an immobile position.

In the embodiment depicted in FIG. 4, the smaller adjustable brace 16 is slideably mounted between the first guide rail 14a and the second guide rail 14b. The first guide ail 14a and the second guide rail 14b are in turn mounted to the bottom plate 28. In this manner, the first guide rail 14a and the second guide rail 14b are immobile relative to the first direction, and the supporting brace 12 is immobile relative to the first direction. The spring 24 is connected at one end to the adjustable brace 16 and at the other end to the bottom plate 28. The top of the fixture 10 is open, allowing the circuitry on the front surface of the integrated circuit 22 to be both electrically probed and viewed. The bottom plate 28 forms a central access port 30, which allows the back surface of the integrated circuit 22 to also be both electrically probed and viewed.

Figure 5:
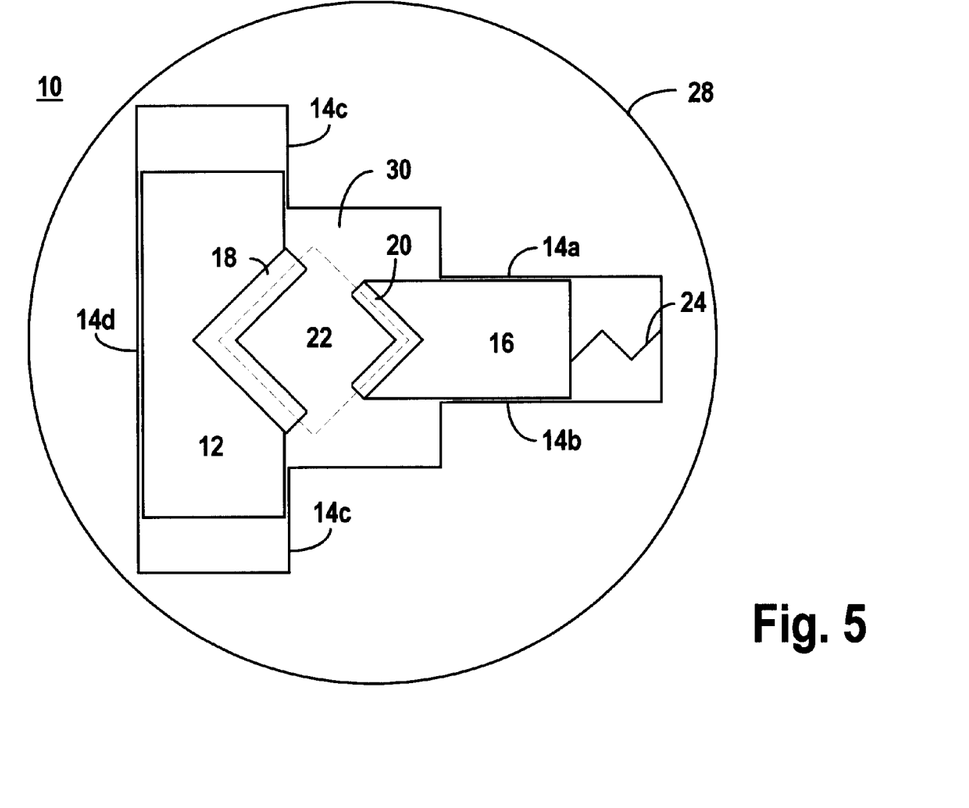
FIG. 5 is a top plan view of a fourth embodiment of the invention.

In another embodiment depicted in FIG. 5, the supporting brace 12 is immobile in the first direction, and the adjustable brace 16 moves back and forth along the first guide rail 14a and the second guide rail 14b in the first direction, under the action of spring 24, as optionally retained by the thumbscrew 25 (not depicted in FIG. 5), as described above. However, in the embodiment depicted in FIG. 5, the supporting brace 12 is not immobile in the second direction, which is perpendicular to the first direction and is within the plane containing both the supporting brace 12 and the adjustable brace 16, as depicted.

In the embodiment of FIG. 5, the supporting brace 12 moves back and forth along the third guide rails 14c and the fourth guide rail 14d in the second direction. In this manner the first jaw piece 18 can be disposed at a position that is skewed from the travel of the second jaw piece 20 along the first direction. In this manner the fixture 10 can accommodate integrated circuits 22 that are not square. As depicted in FIG. 5, the supporting brace 12 and the adjustable brace 16 are not touching the guide rails 14a–14d. However, this is only done for convenience in depicting and understanding the separate pieces of the embodiment. In actual construction the supporting brace 12 and the adjustable brace 16 engage the guide rails 14a–14d.

As depicted, the supporting brace 12 and the adjustable brace 16 are mounted within a single bottom plate 28. However, in other embodiments the supporting brace 12 and the adjustable brace 16 are mounted within a plate that is sandwiched between a bottom plate 28 and a top plate 26, similar to the embodiments of FIGS. 2 and 3, except that in those embodiments the middle plate of the embodiment of FIG. 5 is replaced with a different form of the supporting brace 12 that performs many similar functions.

Many of the elements described above can be applied to the embodiment of FIG. 5. For example, springs 24 can be placed at either end of the supporting brace 12 along the second direction (not depicted in FIG. 5). By having springs 24 on both ends of the supporting brace 12, the supporting brace 12 tends to be self centering in the second direction, which is a third orientation, and is configured by default for a square integrated circuit 22. A thumbscrew 25 can also be added to the supporting brace 12 of FIG. 5 (not depicted), which allows the supporting brace 12 to be positioned along the second direction and then retained in the selected position along the second direction. This may be accomplished in the same manner as depicted for the adjustable brace 16 in FIG. 2. The thumbscrew 25 provides similar benefits to the supporting brace 12 as described above for the adjustable brace 16.

It is appreciated that the invention as described above comprehends numerous adaptations, rearrangements, and substitutions of parts, all of which are considered to be within the scope and spirit of the invention as described, and that the scope of the invention is only to be restricted by the language of the claims given below.

What is claimed is:

1. A fixture for holding an integrated circuit of the type having a thickness, a front side and an opposing back side, a first corner formed between a first edge and an adjacent second edge, and an opposing second corner formed between a third edge and an adjacent fourth edge, the fixture further for positioning the integrated circuit for simultaneously electrically probing and viewing the front side and the back side of the integrated circuit, the fixture comprising:

a supporting brace for providing a support that is immobile in at least a first direction, against which to cooperatively brace the integrated circuit, a first jaw piece disposed adjacent the supporting brace, the first jaw piece having a vee shaped cross section in a first plane for receiving the first corner of the integrated circuit and cooperatively aligning the integrated circuit into a position for simultaneously electrically probing and viewing the front side and the back side of the integrated circuit, and also having a vee shaped cross section in a second plane perpendicular to the first plane for receiving the first and second edges of the integrated circuit, where the vee shaped cross section in the second plane does not substantially overhang either the front side or the back side of the integrated circuit, thereby permitting simultaneous electrical probing and viewing of the front side and the back side of the integrated circuit, an adjustable brace for providing a movable second position in the first direction relative to the supporting brace, against which to cooperatively brace the integrated circuit with the supporting brace, a second jaw piece disposed adjacent the adjustable brace, the second jaw piece having a vee shaped cross section in the first plane for receiving the second corner of the integrated circuit and cooperatively aligning the integrated circuit into a position for simultaneously electrically probing and viewing the front side and the back side of the integrated circuit, and also having a vee shaped cross section in the second plane for receiving the third and fourth edges of the integrated circuit, where the vee shaped cross section in the second plane does not substantially overhang either the front side or the back side of the integrated circuit, thereby permitting simultaneous electrical probing and viewing of the front side and the back side of the integrated circuit, and retaining means for adjustably retaining the adjustable brace relative to the supporting brace.

2. The fixture of claim 1, wherein the retaining means further comprise a thumbscrew and a spring.

3. The fixture of claim 1, wherein the supporting brace is adjustable in a second direction that is perpendicular to the first direction and within a plane containing both the supporting brace and the adjustable brace.

4. The fixture of claim 1, wherein the adjustable brace is immobile in a second direction that is perpendicular to the first direction and within a plane containing both the supporting brace and the adjustable brace.

5. The fixture of claim 1, further comprising first and second guide rails disposed in an immobile position relative to the first direction, the first and second guide rails for receiving the adjustable brace and guiding the adjustable brace in the first direction toward the supporting brace.

6. The fixture of claim 1, wherein the first and second jaw pieces have a vee shaped cross section of about 120 degrees.

7. The fixture of claim 1, wherein the vee shape of the first jaw piece and the second jaw piece each further comprise about a ninety degree angle.

8. The fixture of claim 1, wherein the first and second jaw pieces are formed of Teflon.

9. The fixture of claim 1, wherein the second jaw piece is smaller than the first jaw piece and can nest within the first jaw piece when the adjustable brace is brought toward the supporting brace.

10. The fixture of claim 1, wherein the first jaw piece and the second jaw piece are interchangeable with jaw pieces of different sizes.

11. The fixture of claim 1, further comprising:
   a top plate,
   a bottom plate,
   the supporting brace mounted between the top plate and the bottom plate, and
   the adjustable brace movably mounted between the top plate and the bottom plate.

12. A fixture for holding an integrated circuit of the type having a thickness, a front side and an opposing back side, a first corner and an opposing second corner, the fixture further for positioning the integrated circuit for simultaneously electrically probing and viewing the front side and the back side of the integrated circuit, the fixture comprising:
   a supporting brace for providing a support that is immobile in at least a first direction, against which to cooperatively brace the integrated circuit,
   a first jaw piece disposed adjacent the supporting brace, the first jaw piece having a vee shape for receiving the first corner of the integrated circuit and cooperatively aligning the integrated circuit into a position for simultaneously electrically probing and viewing the front side and the back side of the integrated circuit,
   an adjustable brace for providing a movable second position in the first direction relative to the supporting brace, against which to cooperatively brace the integrated circuit with the supporting brace,
   a second jaw piece disposed adjacent the adjustable brace, the second jaw piece having a vee shape for receiving the second corner of the integrated circuit and cooperatively aligning the integrated circuit into a position for simultaneously electrically probing and viewing the front side and the back side of the integrated circuit, and
   retaining means for adjustably retaining the adjustable brace relative to the supporting brace,
   wherein the fixture has a diameter substantially equal to that of a 200 millimeter silicon wafer, and the fixture fits within a staging means of a wafer probing station designed to receive a 200 millimeter silicon wafer.

13. A fixture for holding an integrated circuit of the type having a thickness, a front side and an opposing back side, a first corner and an opposing second corner, and first, second, third, and fourth orthogonal edges, the fixture further for positioning the integrated circuit for simultaneously electrically probing and viewing the front side and the back side of the integrated circuit, the fixture comprising:
   a supporting brace for providing a support that is immobile in at least a first direction, against which to cooperatively brace the integrated circuit,
   a first jaw piece disposed adjacent the supporting brace, the first jaw piece having a vee shaped cross section in a first plane for receiving the first corner of the integrated circuit and cooperatively aligning the integrated circuit into a position for simultaneously electrically probing and viewing the front side and the back side of the integrated circuit, and also having a vee shaped cross section in a second plane perpendicular to the first plane for receiving the first and second orthogonal edges of the integrated circuit,
   first and second guide rails disposed in an immobile position relative to the first direction,
   an adjustable brace disposed between the first and second guide rails and slideably mounted to the first and second guide rails so as to be selectively moveable along the first and second guide rails, the adjustable brace for providing a movable second position in the first direction relative to the supporting brace, against which to cooperatively brace the integrated circuit with the supporting brace,
   a second jaw piece disposed adjacent the adjustable brace, the second jaw piece having a vee shaped cross section in the first plane for receiving the second corner of the integrated circuit and cooperatively aligning the integrated circuit into a position for simultaneously electrically probing and viewing the front side and the back side of the integrated circuit, and also having a vee shaped cross section in the second plane for receiving the third and fourth orthogonal edges of the integrated circuit, and
   retaining means for adjustably retaining the adjustable brace relative to the supporting brace, the retaining means including a spring for applying pressure against the adjustable brace along the first and second guide rails and towards the supporting brace.

14. The fixture of claim 13, further comprising:
   a top plate,
   a bottom plate,
   the supporting brace mounted between the top plate and the bottom plate,
   the first and second guide rails immovably mounted between the top plate and the bottom plate, and
   the adjustable brace movably mounted on the first and second guide rails between the top plate and the bottom plate.

15. The fixture of claim 13, wherein the supporting brace is adjustable in a second direction that is perpendicular to the first direction and within a plane containing both the supporting brace and the adjustable brace.

16. The fixture of claim 13, wherein the vee shape in the first plane of the first jaw piece and the second jaw piece is about ninety degrees.

17. The fixture of claim 13, wherein the vee shaped cross section in the second plane of the first jaw piece and the second jaw piece is about 120 degrees.

18. The fixture of claim 13, wherein the first jaw piece and the second jaw piece are formed of Teflon.

19. The fixture of claim 13, wherein the second jaw piece is smaller than the first jaw piece and can nest within the first jaw piece when the adjustable brace is brought toward the supporting brace.

20. A fixture for holding an integrated circuit of the type having a front side and an opposing back side, a first corner and an opposing second corner, and first, second, third, and fourth orthogonal edges, the fixture for positioning the integrated circuit for simultaneously electrically probing and viewing the front side and the back side of the integrated circuit, the fixture comprising:
   a generally circular top plate having a diameter of about 200 millimeters, the top plate forming a first central access port for electrically probing and viewing the front side of the integrated circuit, a generally circular bottom plate having a diameter of about 200 millimeters, the bottom plate forming a second central access port for electrically probing and viewing the back side of the integrated circuit, a supporting brace mounted between the top plate and the bottom plate, the supporting brace for providing a support that is immobile in at least a first direction, against which to cooperatively brace the integrated circuit, a first jaw piece disposed adjacent the supporting brace and within the first central access port and the second central access port, the first jaw piece having a vee shape in a first plane for receiving the first corner of the integrated circuit and cooperatively aligning the integrated circuit into a position for simultaneously electrically probing and viewing the front side and the back side of the integrated circuit, and also having a vee shaped cross section in a second plane perpendicular to the first plane for receiving the first and second orthogonal edges of the integrated circuit, first and second guide rails immovably mounted between the top plate and the bottom plate, and disposed in an immobile position relative to the first direction, an adjustable brace disposed between the first and second guide rails and slideably mounted to the first and second guide rails between the top plate and the bottom plate so as to be selectively moveable in the first direction along the first and second guide rails, the adjustable brace for providing a movable second position relative to the supporting brace, against which to cooperatively brace the integrated circuit with the supporting brace, a second jaw piece disposed adjacent the adjustable brace and within the first central access port and the second central access port, the second jaw piece having a vee shape in the first plane for receiving the second corner of the integrated circuit and cooperatively aligning the integrated circuit into a position for simultaneously electrically probing and viewing the front side and the back side of the integrated circuit, and also having a vee shaped cross section in the second plane for receiving the third and fourth orthogonal edges of the integrated circuit, and retaining means for adjustably retaining the adjustable brace relative to the supporting brace, the retaining means including a spring having a first end and a second end, the first end of the spring connected to at least one of the first guide rail, the second guide rail, the supporting brace, the top plate, and the bottom plate, and the second end of the spring disposed adjacent the adjustable brace, for applying pressure against the adjustable brace along the first and second guide rails and towards the first jaw piece of the supporting brace.

* * * * *